United States Patent [19]
Yanagida

[11] Patent Number: 5,933,752
[45] Date of Patent: Aug. 3, 1999

[54] METHOD AND APPARATUS FOR FORMING SOLDER BUMPS FOR A SEMICONDUCTOR DEVICE

[75] Inventor: Toshiharu Yanagida, Kanagawa, Japan

[73] Assignee: Sony Corporation, Tokyo, Japan

[21] Appl. No.: 08/979,784

[22] Filed: Nov. 26, 1997

[30] Foreign Application Priority Data

Nov. 28, 1996 [JP] Japan ................................. 8-317671

[51] Int. Cl.[6] ................................................. H01L 21/44
[52] U.S. Cl. ........................... 438/613; 438/612; 438/615
[58] Field of Search ..................................... 438/613, 612, 438/615

[56] References Cited

U.S. PATENT DOCUMENTS

| | | | |
|---|---|---|---|
| 4,861,425 | 8/1989 | Greer et al. | 438/615 |
| 5,593,903 | 1/1997 | Beckenbaugh et al. | 438/612 |
| 5,698,465 | 12/1997 | Lynch et al. | 438/125 |

*Primary Examiner*—Kevin M. Picardat
*Assistant Examiner*—Deven Collins
*Attorney, Agent, or Firm*—Hill & Simpson

[57] ABSTRACT

Disclosed herein is a solder bump forming method and a sputter deposition apparatus used in this method which improves a bonding strength between a metal film having a solder bump forming region and an undercoating for the metal film. This method includes the steps of forming an opening through the undercoating, forming the metal film on the undercoating by a lift-off process so that the metal film is connected through the opening to an electrode pad formed on a substrate of a semiconductor device chip and has the solder bump forming region different from a region on the electrode pad, and forming a solder bump on the solder bump forming region of the metal film. This method further includes the steps of heating the undercoating after forming the resist pattern having an opening for exposing the electrode pad, the undercoating corresponding to the solder bump forming region, and a region connecting the electrode pad and the solder bump forming region, performing plasma processing to reduce the diameter of the opening of the resist pattern at its opening edge, and depositing the metal film on the undercoating. The sputter deposition apparatus includes a plasma processing device for performing plasma processing to the substrate to reduce the diameter of the opening of the resist pattern at its opening edge, and a sputter deposition device for depositing the metal film on the undercoating. The plasma processing device includes at least a lamp heater for heating the substrate.

21 Claims, 7 Drawing Sheets

METHOD AND APPARATUS FOR FORMING SOLDER BUMPS FOR A SEMICONDUCTOR DEVICE

BACKGROUND OF THE INVENTION

The present invention relates to a solder bump forming method suitably applied to the manufacture of a semiconductor device, in which a barrier metal such as a BLM (Ball Limiting Metal) film is used to relocate a solder bump, e.g., a solder ball bump in a region different from a region on an electrode pad, and more particularly to a solder bump forming method and an apparatus for carrying out the method wherein in flip chip mounting a semiconductor device chip on a mounting substrate through a solder bump relocated on a metal film, e.g., a barrier metal deposited on an undercoating formed of an organic compound such as polyimide, the reliability on bonding strength of the solder bump and mechanical strength and electrical characteristics of a product device assembled by flip chip mounting can be improved.

For further miniaturization of electronic equipment, increasing a components mounting density is an important point. Also regarding a semiconductor IC chip, a high-density mounting technique such as a flip chip mounting method for mounting an LSI bare chip directly on a printed wiring board rather than a related art package mounting method is increasingly developed at present.

As the flip chip mounting method, various methods including an Au stud bump method and a solder ball bump method are used. In any methods, a barrier metal is interposed between an Al electrode pad of a semiconductor IC and a bump material, so as to improve adhesion between the electrode pad and the bump and prevent mutual diffusion of metal components.

In the solder ball bump method, the barrier metal has an effect on the finished shape of the bump, so the barrier metal is usually called a BLM (Ball Limiting Metal) film.

As the structure of the BLM film in the solder bump method, a three-layer structure of Cr/Cu/Au is most generally used. The Cr film as a lower layer functions mainly as an adhesion layer to the Al electrode pad. The Cu film as an intermediate layer functions mainly as an antidiffusion layer for preventing diffusion of solder metal components. The Au film as an upper layer functions mainly as an antioxidation film for preventing oxidation of the Cu film.

A related art solder ball bump forming method includes the steps of depositing a BLM film on an Al electrode pad of an LSI chip, pattering the BLM film, depositing a solder metal film composed mainly of Pb and Sn on the BLM film, and melting the solder metal film by heat treatment to deform it into a ball, thus forming the solder ball bump on the electrode pad.

FIGS. 1A to 1E show a related art method of forming a solder ball bump as a bonding portion for a flip chip IC on an electrode pad by using a lift-off process for a photoresist film and a vacuum evaporation process for a solder metal.

As shown in FIG. 1A, an Al electrode pad 82 of Al-Cu alloy, for example, is formed on a semiconductor substrate 81 of silicon, for example, by sputtering and etching. Then, a surface protective film 83 of polyimide or silicon nitride, for example, is formed over the entire surface of the substrate 81. A first opening 84 is next formed through the surface protective film 83 so as to expose the electrode pad 82, and a multilayer metal film of Cr/Cu/Au, for example, as a BLM film 85 is formed on the Al electrode pad 83 including a side wall of the first opening 84.

As shown in FIG. 1B, a resist pattern 87 having a second opening 86 larger in diameter than the first opening 84 is formed on the BLM film 85.

As shown in FIG. 1C, a solder evaporated film 88 is deposited over the entire surface of the substrate by a vacuum evaporation process.

As shown in FIG. 1D, the solder evaporated film 88 on the resist pattern 87 is removed together with the resist pattern 87 by a lift-off process for a photoresist film to leave the solder evaporated film 88 on the Al electrode pad 82.

As shown in FIG. 1E, the solder evaporated film 88 is melted by heat treatment to form a ball-shaped solder ball bump 89 on the Al electrode pad 82 through the BLM film 85.

In the above method, a process flow till the pattern formation of the BLM film 85 shown in FIG. 1A by use of a lift-off process of a photoresist film will now be described in detail with reference to FIGS. 2A to 2D.

As shown in FIG. 2A, the surface protective film (passivation film) 83 is deposited on the Al electrode pad 82 formed on the semiconductor substrate 81, and a first opening 90 having a predetermined size as a connection hole is formed through the surface protective film 83. Then, a photoresist film 91 is deposited over the substrate, and next patterned to form a second opening 92 larger in diameter than the first opening 90 of the passivation film 83.

Then, the wafer having a layered structure shown in FIG. 2A is set in a plasma processing device to perform pretreatment prior to deposition of the BLM film 85 (usually called back-sputtering) by RF plasma. As a result, the side wall of the second opening 92 of the photoresist film 91 is deformed into an overhanging shape to reduce the diameter of the second opening 92 at its opening edge 93 as shown in FIG. 2B.

In the next step, the multilayer film of Cr/Cu/Au is deposited as the BLM film 85 by sputtering on the substrate. As shown in FIG. 2C, the BLM film 85 is not deposited on an overhanging side wall surface 94 of the resist pattern 91 formed by the RF plasma pretreatment mentioned above, so that the BLM film 85 deposited on the substrate is separated into a part deposited on the Al electrode pad 82 and a part deposited on the photoresist film 91.

In the next step, the wafer having a layered structure shown in FIG. 2C is immersed into a resist removing liquid and oscillated with heat. As a result, the BLM film 85 deposited on the photoresist film 91 is lifted off together with the photoresist film 91, thereby forming a pattern of the BLM film 85 connected to the Al electrode pad 82 through the first opening 90 as the connection hole (corresponding to the first opening 84 shown in FIG. 1A).

As described above, in most cases according to the related art solder ball bump method, solder ball bumps are formed on only the electrode pads located in the periphery of the LSI chip.

However, in a future LSI chip with the microstructure of the semiconductor device chip being advanced and the distance (pitch) between the adjacent electrode pads being increasingly reduced, the solder ball bumps formed on the adjacent electrode pads may come into contact with each other to cause an electrical short circuit in the above related art method. If the bump diameter is reduced to avoid the contact between the adjacent solder ball bumps, it become difficult to maintain a bonding strength between the LSI chip and a printed wiring board, resulting in a reduction in reliability of mechanical connection and electrical connection.

As means of avoiding the contact between the adjacent solder ball bumps, a method of relocating the bumps on a region of the LSI chip different from a region on the electrode pads has been adopted. This method is schematically shown in FIG. 3, for example. As shown in FIG. 3, an additional bump forming region B is provided at a position different from an electrode pad A, and a solder ball bump C is formed on the bump forming region B. Further, any wiring D is formed between the electrode pad A and the bump forming region B.

If the bump forming region B and the wiring D for relocation of the bump can be formed from the BLM film, the related art method can be utilized without increasing the number of steps only by changing a mask pattern for the photoresist film for the lift-off process. Accordingly, no additional processing devices are required to have a great advantage from the viewpoints of cost and productivity.

In this respect, the following process flow has been developed. The outline of this process flow will now be described with reference to FIGS. 4A to 4G.

As shown in FIG. 4A, an Al electrode pad 104 is provided on a semiconductor substrate 102, and a silicon nitride film 106 as a surface protective film is next deposited over the entire surface of the substrate 102. Further, a first opening 108 is formed through the silicon nitride film 106 so as to expose the Al electrode pad 104.

As shown in FIG. 4B, a first polyimide film 110 is deposited over the entire surface of the substrate 102, and patterned to form a second opening 112 smaller in diameter than the first opening 108 of the silicon nitride film 106 at a position over the Al electrode pad 104.

In the next step, a photoresist film 114 is deposited over the entire surface of the substrate and patterned to form a third opening 116 for exposing the Al electrode pad 104, a solder ball bump forming region, and a wiring forming region connecting the Al electrode pad 104 and the solder ball bump forming region. Subsequently, a BIM film 118 is deposited by sputtering over the entire surface of the substrate. Prior to sputter deposition of the BLM film 118, the photoresist film 114 is subjected to back-sputtering to thereby reduce the diameter of the third opening 116 at its opening edge, so that the BLM film 118 is deposited separately on a region corresponding to the third opening 116 and on the photoresist film 114 as shown in FIG. 4C.

As shown in FIG. 4D, the photoresist film 114 is lifted off to remove the BLM film 118 on the photoresist film 114 together with the photoresist film 114, thereby forming a BLM rewiring portion 120 connected to the Al electrode pad 104 and having the solder ball bump forming region different from a region on the Al electrode pad 104, and the wiring region between the Al electrode pad 104 and the solder ball bump forming region.

As shown in FIG. 4E, a second polyimide film 122 is deposited over the entire surface of the substrate and patterned to form a fourth opening 124 for exposing the solder ball bump forming region.

In the next step, a lift-off process for a photoresist film is carried out as similarly to the related art method shown in FIGS. 1B to 1D to form a solder evaporated film 126 composed mainly of Pb and Sn at the fourth opening 124 as shown in FIG. 4F.

Further, as similarly to the related art method, the solder evaporated film 126 is melted by heat treatment to form a ball-shaped solder ball bump 128 on the BLM film 118 as shown in FIG. 4G.

However, in the actual solder ball bump forming step according to the above process flow, there arises a new problem such that a bonding strength of the solder ball bump is low. This problem is due to the fact that since most of the undercoating for the BLM film is the first polyimide film 110 of an organic compound, the adhesion at the interface between the BLM film and the underlying polyimide film becomes weaker than the adhesion at the interface between the BLM film and the underlying Al electrode pad in the related art structure as shown in FIG. 1E.

As a result, the strength of a bump bonding portion of a product assembled by flip chip mounting a semiconductor device chip on a printed wiring board through the solder ball bumps by the above process flow becomes low to cause a reduction in reliability of the mechanical strength and electrical connection of the product set and also exert an adverse effect on durability.

SUMMARY OF THE INVENTION

It is accordingly an object of the present invention to provide a solder ball bump forming method and an apparatus for carrying out the method which can improve the adhesion between a metal film such as a barrier metal and an undercoating layer such as an insulating film in forming a relocated solder bump, thereby obtaining high reliability of mechanical connection and electrical connection.

The present inventor has investigated the cause of a reduction in adhesion between the metal film and the undercoating layer, e.g., insulating film in the case of forming a solder ball bump by the related art method, and as the result has found that the reduction in adhesion is caused by insufficient curing of the undercoating layer and accordingly outgassing from the undercoating layer occurs during sputter deposition of the metal film, thus resulting in a reduction in adhesion between the metal film and the undercoating layer.

In accordance with an aspect of the present invention on the basis of the above knowledge, there is provided in a solder bump forming method including the steps of forming an opening through an insulating film, forming a metal film on the insulating film by a lift-off process for a resist pattern so that the metal film is connected through the opening to an electrode pad formed on a substrate of a semiconductor device chip and has a solder bump forming region different from a region on the electrode pad, and forming a solder bump on the solder bump forming region of the metal film; the improvement including the steps of forming on the substrate the resist pattern having an opening over the electrode pad, the solder bump forming region on the insulating film, and a wiring forming region connecting the electrode pad and the solder bump forming region; heating the insulating film; performing plasma processing to deform a side wall of the opening of the resist pattern on the insulating film into an overhanging shape and thereby reduce the diameter of the opening of the resist pattern at its opening edge; and depositing the metal film on the substrate by sputtering.

Preferably, the heating step is performed under a high vacuum. Accordingly, the curing of the insulating film can be carried out more effectively. Although the form of the solder bump is not limited, this method is preferably applied to formation of a solder ball bump. Although the kind of the insulating film is not limited, a polyimide film is preferable. Further, although the kind of the metal film is not limited, a multilayer metal film having a barrier metal layer is preferable. Further, a BLM film is preferably employed as the multilayer metal film.

In the solder bump forming method according to the present invention, heat treatment of the insulating film is sufficiently carried out by using a plasma processing device or a preliminary vacuum chamber to be hereinafter described, including a lamp heater, for example, in addition to usual heating means prior to sputter deposition of the metal film, e.g., the BLM film.

Accordingly, the insulating film can be sufficiently cured by the heat from the lamp heater and the other heating means, so that outgassing from the insulating film during sputter deposition of the metal film can be suppressed to thereby improve the adhesion between the insulating film such as a polyimide film and the metal film such as a barrier metal.

In accordance with another aspect of the present invention, there is provided a sputter deposition apparatus (which will be hereinafter referred to as a first sputter deposition apparatus) for depositing a metal film on a substrate in forming a solder bump, including a plasma processing device for performing plasma processing to the substrate having a resist pattern having an opening over an electrode pad formed on the substrate, a solder bump forming region formed on an insulating film, and a wiring forming region connecting the electrode pad and the solder bump forming region to deform a side wall of the opening of the resist pattern into an overhanging shape and thereby reduce the diameter of the opening at its opening edge; and a sputter deposition device for depositing the metal film on the electrode pad, the insulating film both exposed to the opening, and the resist pattern; the plasma processing device having at least a lamp heater as substrate heating means.

Preferably, the plasma processing device further has additional heating means embedded in a wafer stage for holding a wafer.

The first sputter deposition apparatus is preferably used for deposition of a metal film, e.g., a barrier metal for formation of a solder bump. In the present invention, the form of the solder bump is not limited, and this apparatus is used also for formation of a solder ball bump, for example.

By using the first sputter deposition apparatus, the insulating film, e.g., a polyimide film is subjected to vacuum heating from the wafer surface by the lamp heater such as an infrared lamp in addition to heat conduction from the wafer stage heated to a controlled temperature as the pretreatment just prior to sputter deposition of the metal film such as a BLM film. Accordingly, in comparison with a related art sputter deposition apparatus utilizing only radiant heat from the plasma and ion bombardment, the first sputter deposition apparatus can more effectively remove from the wafer the moisture (primarily caused by reabsorption during steps after curing) contained in a polyimide film as the undercoating for the BLM film. In the following description, a polyimide film and a BLM film will be used as the insulating film and the metal film, respectively.

Since the polyimide film is preliminarily subjected to sufficient curing in this apparatus, the deformation and opening diameter reduction process for the resist pattern required for the lift-off process can be effectively carried out in the back-sputtering process. Further, since outgassing from the polyimide film as the undercoating is suppressed during sputter deposition of the BLM film, the adhesion between the polyimide film and the BLM film can be improved. Accordingly, it is possible to solve the related art problem such that the bonding strength of solder bumps is low in the case of relocating the solder bumps by use of the BLM film formed on the polyimide film. In addition, the related art problem such that the deposition process for the BLM film is adversely affected by impurity gases can be solved to thereby allow sputter deposition of the BLM film with a high purity.

Consequently, by forming the solder bumps, e.g., solder ball bumps according to the apparatus of the present invention, the reliability of mechanical strength and electrical characteristics of an electronic component assembled by flip chip mounting a semiconductor device chip can be improved.

In accordance with a further aspect of the present invention, there is provided a sputter deposition apparatus (which will be hereinafter referred to as a second sputter deposition apparatus) for depositing a metal film on a substrate in forming a solder bump, including a preliminary vacuum chamber having heating means for heating the substrate; a plasma processing device for performing plasma processing to the substrate having a resist pattern having an opening over an electrode pad formed on the substrate, a solder bump forming region formed on an insulating film, and a wiring forming region connecting the electrode pad and the solder bump forming region to deform a side wall of the opening of the resist pattern into an overhanging shape and thereby reduce the diameter of the opening at its opening edge, the plasma processing device being connected to the preliminary vacuum chamber; and a sputter deposition device for depositing the metal film on the electrode pad, the insulating film both exposed to the opening, and the resist pattern.

Preferably, the heating means of the preliminary vacuum chamber includes at least one of an electric heater embedded in a wafer stage for placing the substrate and a lamp heater opposed to the wafer stage.

The second sputter deposition apparatus is preferably used for deposition of a metal film, e.g., a barrier metal for formation of a solder bump. In the present invention, the form of the solder bump is not limited, and this apparatus is used also for formation of a solder ball bump, for example.

In the second sputter deposition apparatus, the insulating film is cured in the preliminary vacuum chamber independent of the plasma processing device for performing the back-sputtering. Accordingly, unlike the first sputter deposition apparatus, there is no possibility that the plasma chamber may be contaminated by the moisture evaporated from the resist pattern or the insulating film during the heat treatment of the wafer. As a result, the back-sputtering optimized for the lift-off process can be carried out more effectively.

By using the second sputter deposition apparatus, the polyimide film can be subjected to vacuum heating from the wafer surface by the lamp heater such as an infrared lamp in addition to heat conduction from the wafer stage heated to a controlled temperature as the pretreatment just prior to sputter deposition of the BLM film in the preliminary vacuum chamber such as a load-lock chamber having heating means. Accordingly, in comparison with a related art sputter deposition apparatus utilizing only radiant heat from the plasma and ion bombardment, the second sputter deposition apparatus can more effectively remove from the wafer the moisture (primarily caused by reabsorption during steps after curing) contained in the polyimide film as the undercoating for the BLM film.

Thus, the second sputter deposition apparatus can also exhibit operations and effects similar to those of the first sputter deposition apparatus.

DETAILED DESCRIPTION OF THE PREFERRED EMBODIMENTS

Some preferred embodiments of the present invention will now be described specifically in detail with reference to the attached drawings.

First Preferred Embodiment

Figure 5:
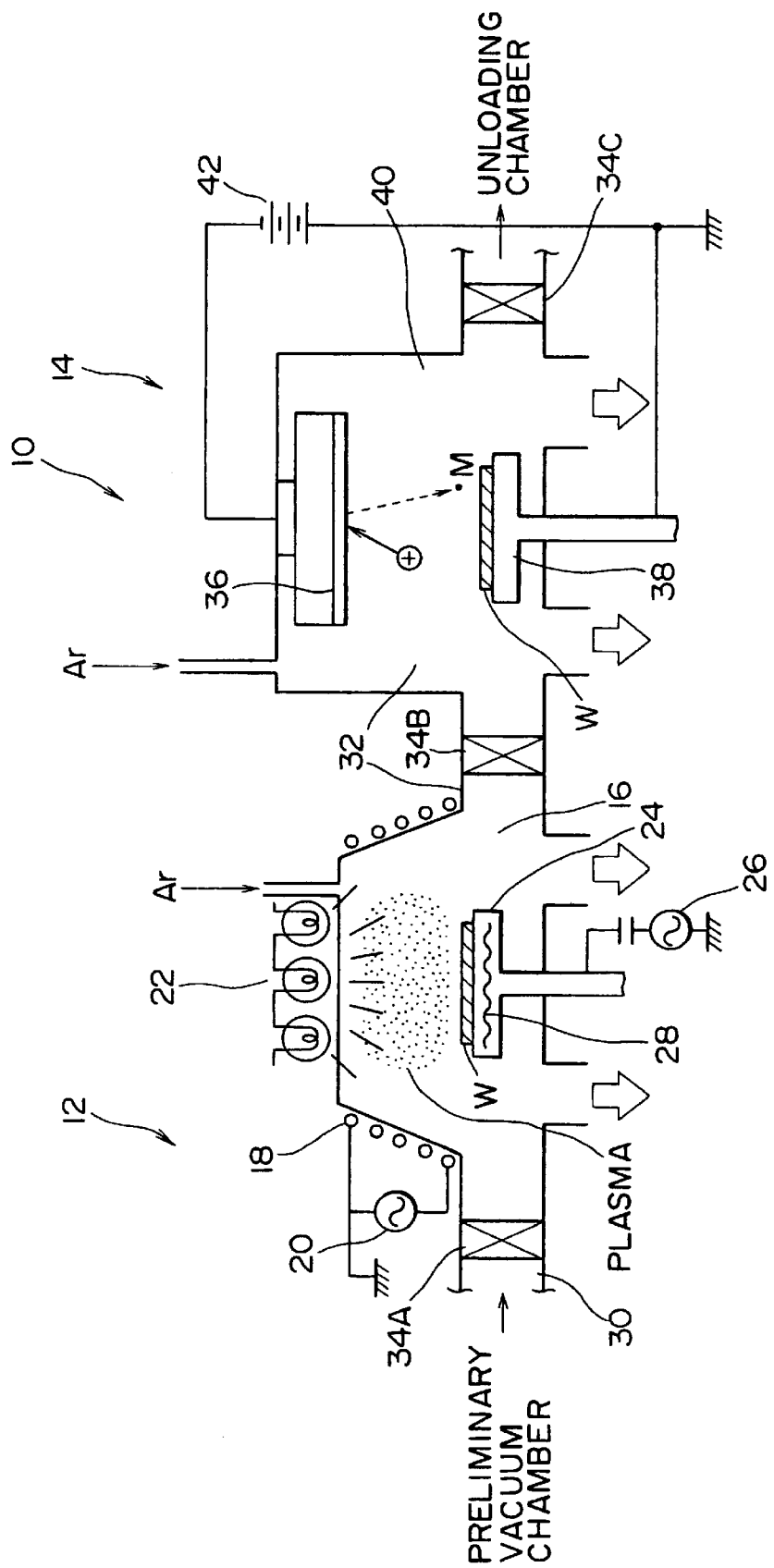
FIG. 5 is a schematic illustration showing the configuration of a preferred embodiment of the first sputter deposition apparatus according to the present invention.

This preferred embodiment is a preferred embodiment of the first sputter deposition apparatus according to the present invention, and FIG. 5 is a schematic illustration of the configuration of this preferred embodiment.

Referring to FIG. 5, reference numeral 10 generally denotes a sputter deposition apparatus of this preferred embodiment. The sputter deposition apparatus 10 is composed of an ICP (Inductively Coupled Plasma) processing device 12 (which will be hereinafter referred to as a plasma processing device 12) provided as a pretreatment device for performing back-sputtering prior to metal film deposition and capable of performing heating with a lamp heater and a sputter deposition device 14 provided continuously to the plasma processing device 12.

The plasma processing device 12 is a device having a chamber 16 in which a plasma is generated, an inductive coupling coil 18 provided at an upper portion of the chamber 16, and a plasma generating power supply 20 for applying a voltage to the inductive coupling coil 18, thereby generating the plasma in the chamber 16 to perform plasma processing. The plasma processing device 12 further has an infrared lamp 22 provided on the ceiling of the chamber 16 so as to be opposed to a wafer stage 24 to radiate infrared light into the chamber 16.

The wafer stage 24 on which a wafer W is placed is provided in the chamber 16. The plasma processing device 12 further has a substrate biasing power supply 26 for applying a bias voltage to the wafer stage 24. An electric heater 28 for heating the wafer W is embedded in the wafer stage 24. The chamber 16 is provided with an inlet 30 communicating with a load-lock chamber (not shown) and an outlet 32 communicating with the sputter deposition device 14. The inlet 30 and the outlet 32 are provided with gate valves 34A and 34B, respectively.

The chamber 16 is evacuated by a vacuum pump (not shown) and simultaneously supplied with an Ar gas. Under a high vacuum the wafer W placed on the wafer stage 24 is subjected to heating and also subjected to back-sputtering by the plasma generated by an electromagnetic wave from the inductive coupling coil 18.

The sputter deposition device 14 is a DC sputter deposition device, which has a sputter deposition chamber 40 having a metal target 36 as a cathode at an upper position and a wafer stage 38 as an anode on which a wafer W is placed at a lower position, and also has a DC power supply 42 for applying a DC voltage between the metal target 36 and the wafer stage 38. The sputter deposition chamber 40 is provided with an outlet communicating with an unloading chamber (not shown), and this outlet is provided with a gate valve 34C.

The sputter deposition chamber 40 is evacuated by a vacuum pump (not shown) and simultaneously supplied with an Ar gas, and a voltage is applied between the wafer stage 38 and the metal target 36 to generate a glow discharge. Accordingly, the metal target 36 is bombarded by highly energetic ions to cause ejection of component atoms of the metal target 36 from the surface thereof. The component atoms thus ejected are deposited onto the wafer W placed on the wafer stage 38, thereby forming a BLM film on the wafer W.

In the sputter deposition apparatus 10 mentioned above, the plasma processing device 12 has the infrared lamp 22, so that the wafer W can be heated by infrared light from the infrared lamp 22 in addition to by the electric heater 28 embedded in the wafer stage 24 and by radiant heat from the plasma.

Accordingly, in comparison with a related art sputter deposition apparatus utilizing only radiant heat from the plasma and ion bombardment, the sputter deposition apparatus in this preferred embodiment can more effectively remove from the wafer the moisture (primarily caused by reabsorption during steps after curing) contained in a polyimide film as an undercoating for the BLM film.

The polyimide film can be preliminarily subjected to sufficient curing, so that the deformation and opening diameter reduction process of the resist pattern required for the lift-off process can be effectively carried out in the back-sputtering. Furthermore, outgassing from the polyimide film as the undercoating can be suppressed during sputter deposition of the BLM film, so that adhesion between the polyimide film and the BLM film can be improved. Furthermore, since the deposition process is not adversely affected by impurity gases unlike in the related art, the BLM film with a high purity can be deposited by sputtering.

Second Preferred Embodiment

Figure 6:
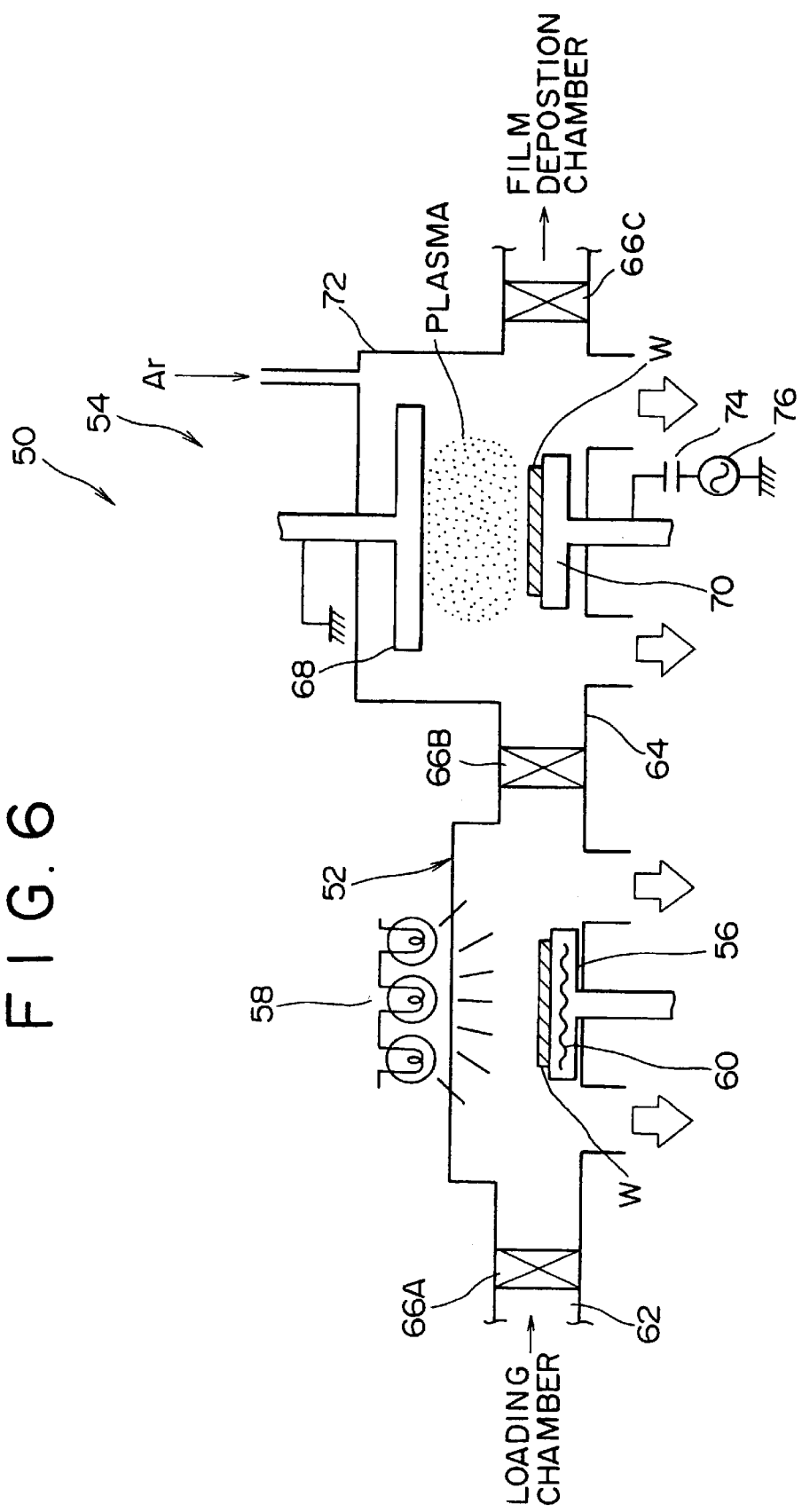
FIG. 6 is a schematic illustration showing the configuration of a preferred embodiment of the second sputter deposition apparatus according to the present invention.

This preferred embodiment is a preferred embodiment of the second sputter deposition apparatus according to the present invention, and FIG. 6 is a schematic illustration of the configuration of this preferred embodiment.

Referring to FIG. 6, reference numeral 50 generally denotes a sputter deposition apparatus of this preferred embodiment. The sputter deposition apparatus 50 is composed of a load-lock chamber 52 capable of heating a wafer with a lamp heater, a plasma processing device 54 provided continuously to the load-lock chamber 52 to perform back-sputtering, and a sputter deposition device (not shown) having the same configuration as that of the sputter deposition device 14 in the first preferred embodiment to perform sputter deposition of a metal film such as a BLM film.

The load-lock chamber 52 has a wafer stage 56 for placing a wafer W thereon and an infrared lamp 58 for radiating infrared light to heat the wafer W. The infrared lamp 58 is provided on the ceiling of the chamber so as to be opposed to the wafer stage 56. The wafer stage 56 is provided with an electric heater 60 for heating the wafer W. The load-lock chamber 52 has an inlet 62 communicating with a loading chamber (not shown) and an outlet 64 communicating with the plasma processing device 54. The inlet 62 and the outlet 64 are provided with gate valves 66A and 66B, respectively.

The load-lock chamber 52 is evacuated by a vacuum pump (not shown) to maintain a high vacuum, thereby functioning as a preliminary chamber for the back-sputtering device 54. Simultaneously, the load-lock chamber 52 functions to heat the wafer W placed on the wafer stage 56 by infrared light from the infrared lamp 58 and heat from the electric heater 60.

The plasma processing device 54 is a parallel-plate type plasma processing device, which has a chamber 72 having a pair of opposed parallel plate electrodes, i.e., a grounded cathode plate 68 and an anode plate 70 to which an RF voltage is applied, and an RF power supply 76 having a coupling capacitor 74 for applying a high-frequency voltage to the anode plate 70. The chamber 72 has an outlet communicating with the sputter deposition device, and this outlet is provided with a gate valve 66C.

The chamber 72 is evacuated by a vacuum pump (not shown) and simultaneously supplied with an Ar gas. A high-frequency voltage is applied between the electrode plates 68 and 70 to thereby generate a plasma therebetween, thus subjecting a wafer W placed on the anode plate 70 to back-sputtering.

In the sputter deposition apparatus 50 mentioned above, prior to the back-sputtering, the wafer W held on the wafer stage 56 heated to a controlled temperature in the load-lock chamber 52 is heated by the infrared light from the infrared lamp 58, thus subjecting the wafer W to heating under a high vacuum.

Accordingly, in comparison with a related art sputter deposition apparatus utilizing only radiant heat from the plasma and ion bombardment, the sputter deposition apparatus in this preferred embodiment can more effectively remove from the wafer the moisture (primarily caused by reabsorption during steps after curing) contained in a polyimide film as an undercoating for the BLM film. Thus, the sputter deposition apparatus of this preferred embodiment can exhibit an effect similar to that of the sputter deposition apparatus of the first preferred embodiment.

Third Preferred Embodiment

This preferred embodiment is a preferred embodiment of the solder ball bump forming method according to the present invention, wherein the sputter deposition apparatus of the first preferred embodiment is used to form a BLM film pattern. The process conditions to be described later in this preferred embodiment and the subsequent preferred embodiment are merely illustrative for understanding of the method of the present invention and not limitative.

Figure 7A:
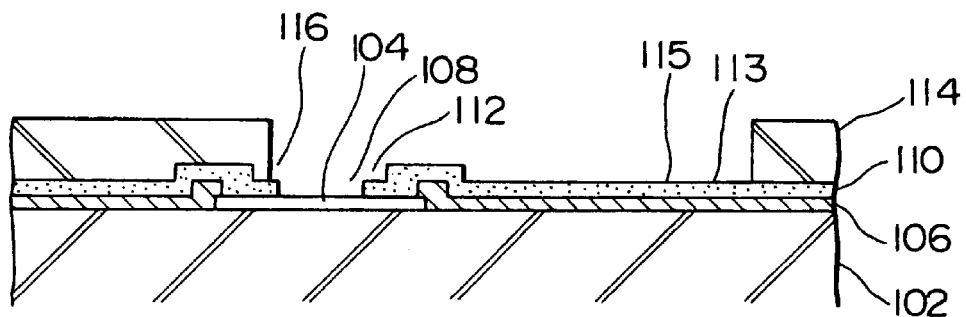
FIGS. 7A to 7D are sectional views of a wafer, showing a solder ball bump forming method according to the present invention.

As shown in FIG. 7A, a silicon nitride film 106 and a first polyimide film 110 are formed on a semiconductor substrate 102, and a first opening 108 and a second opening 112 are formed through the films 106 and 110, respectively, over an Al electrode pad 104 as similarly to the related art method.

Then, a photoresist film 114 is formed over the substrate 102, and a third opening 116 is formed through the photoresist film 114 at a region including the Al electrode pad 104, a solder ball bump forming region 113, and a wiring forming region 115 connecting the Al electrode pad 104 and the solder ball bump forming region 113 as shown in FIG. 7A.

The wafer W having a multilayer structure shown in FIG. 7A is subjected to vacuum heating under the conditions to be described below by using the plasma processing device 12 of the sputter deposition apparatus 10 shown in FIG. 5. The vacuum heating is performed by evacuating the chamber 16 to maintain a high vacuum and heating the wafer W by the heat from the electric heater 28 embedded in the wafer stage 24 and the radiation from the infrared lamp 22 provided on the ceiling of the chamber 16. Accordingly, the wafer W can be quickly heated and its temperature can be controlled uniformly and precisely to thereby allow sufficient curing of the first polyimide film 110.

(1) Vacuum Heating

Ar flow rate: 100 sccm

Pressure in the chamber: 2 Pa

Wafer stage temperature: 95° C.

ICP source power: Not applied

Substrate bias voltage: Not applied

Infrared lamp: ON

Process time: 120 seconds

Nest, the wafer W is subjected to back-sputtering under the following conditions as a second-stage pretreatment by using the plasma processing device 12.

(2) Back-sputtering

Ar flow rate: 25 sccm

Pressure in the chamber: 0.7 Pa

Wafer stage temperature: 95° C.

ICP source power: 1 kW (450 kHz)

Substrate bias voltage: 75 V (13.56 MHz)

Infrared lamp: OFF

Pressure time: 120 seconds

Figure 7B:
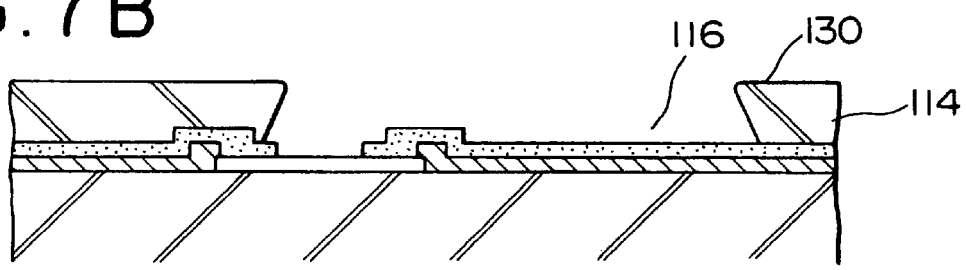

By the back-sputtering, the surface layer of the photoresist film 114 undergoes bombardment by the $Ar^+$ions from the discharge plasma, so that the side wall of the third opening 116 formed through the resist pattern is deformed like an overhang to reduce the diameter of the third opening 116 at its opening edge 130 as shown in FIG. 7B.

By the vacuum heating, the moisture contained in the polyimide film as the undercoating for the BLM film is effectively removed from the wafer. Accordingly, in the back-sputtering, the deformation and opening diameter reduction process for the opening of the resist pattern gradually proceeds at a low substrate bias voltage with the wafer being exposed to radiant heat from the plasma and incident energy of the ions. Thus, optimum pretreatment for application to a lift-off process can be carried out.

In the next step, the wafer W is fed to the sputter deposition device 14 under a high vacuum, and a BLM film 118 is formed on a region including the Al electrode pad 104, the solder ball bump forming region 113, and the wiring forming region 115 connecting the Al electrode pad 104 and the solder ball bump forming region 113 and on the photoresist film 114 under the following conditions.

The BLM film 118 is formed as a three-layer laminated metal film consisting of a 0.1 $\mu$m-thick Cr film functioning as an adhesion layer to the Al electrode pad, a 1.0 $\mu$m-thick Cu film functioning as a barrier metal for solder, and a 0.1 $\mu$m-thick Au film functioning as an antioxidation film for the barrier metal.

(3) Deposition of the Cr film

DC power: 3.0 kW

Ar flow rate: 75 sccm

Pressure in the chamber: 1.0 Pa

Wafer stage temperature: 50° C.

(4) Deposition of the Cu film

DC power: 9.0 kW

Ar flow rate: 100 sccm

Pressure in the chamber: 1.0 Pa

Wafer stage temperature: 50° C.

(5) Deposition of the Au film

DC power: 3.0 kW

Ar flow rate: 75 sccm

Pressure in the chamber: 1.5 Pa

Wafer stage temperature: 50° C.

Figure 7C:
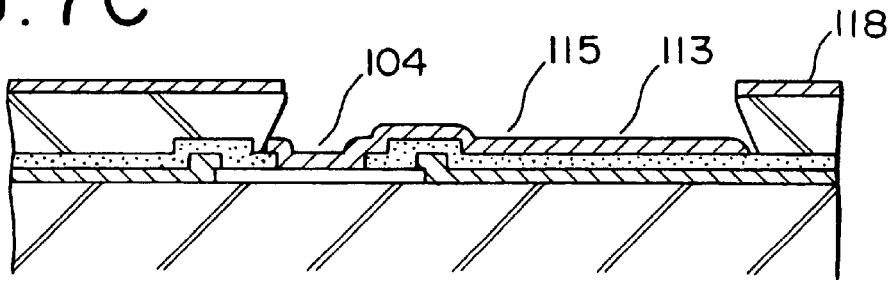

By the pretreatment mentioned previously, the BLM film 118 is not deposited on the overhanging side wall surface of the third opening 116 of the resist pattern as shown in FIG. 7C, so that the BLM film 118 is deposited separately in a bottom region of the first opening 108 and in a region on the photoresist film 114.

By the effect of the preliminary vacuum heating, outgassing from the polyimide film as the undercoating is suppressed during the sputter deposition of the BLM film, thereby improving adhesion between the polyimide film and the BLM film. Further, outgassing from the first polyimide film 110 and the resist pattern is effectively suppressed, so that a process atmosphere is not adversely affected by impurity gases. Accordingly, the BLM film 118 with a high purity can be formed by sputtering.

Figure 7D:
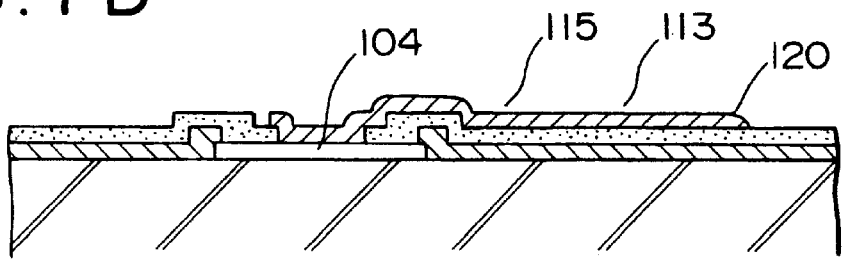

In the next step, the wafer is immersed into a resist removing liquid composed of $(CH_3)_2SO$ (Dimethyl sulfoxide) and $CH_3NC_4H_6O$ (N-methyl-2-pyrrolidone) and oscillated with heat, thereby lifting off (removing) the unnecessary BLM film 118 on the photoresist film 114 together with the resist pattern as shown in FIG. 7D and leaving a BLM film rewiring portion 120 on the Al electrode pad 104, the solder ball bump forming region 113, and the wiring forming region 115.

Figure 1A:
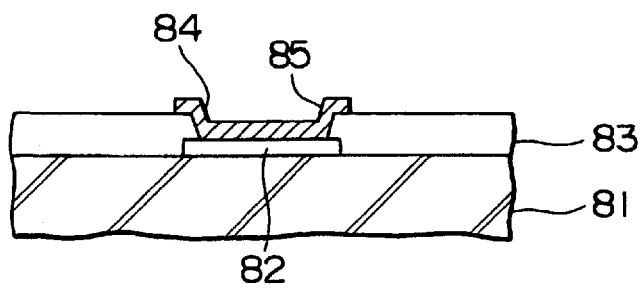
FIGS. 1A to 1E are sectional views of a wafer, showing a related art solder ball bump forming method.
Figure 1B:
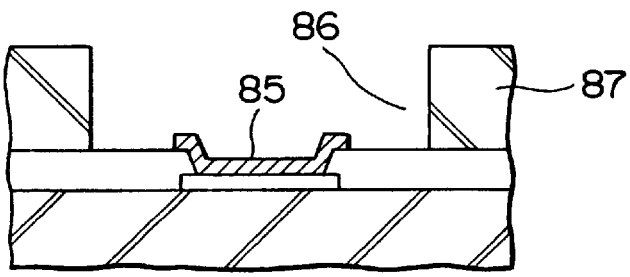
Figure 1C:
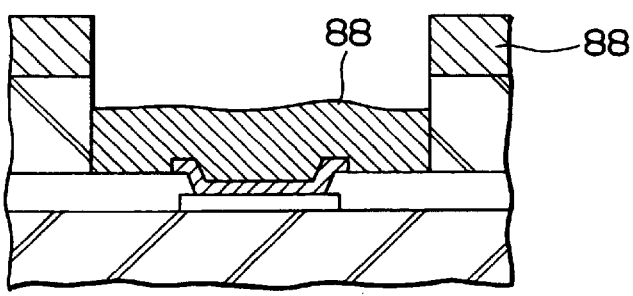
Figure 1D:
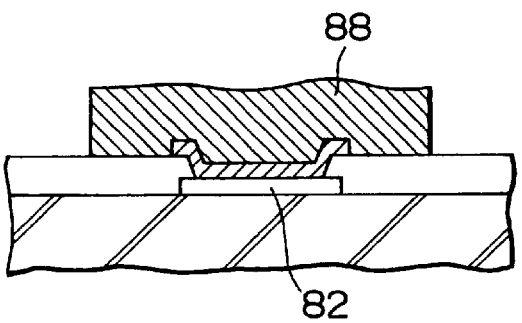
Figure 1E:
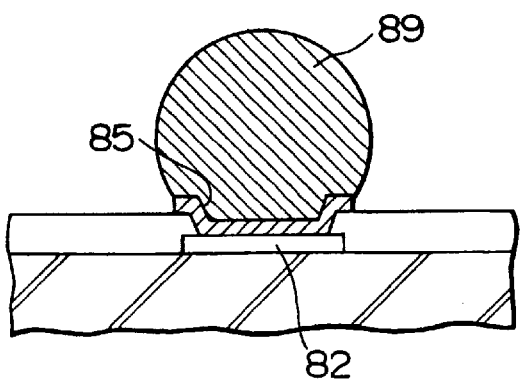
Figure 2A:
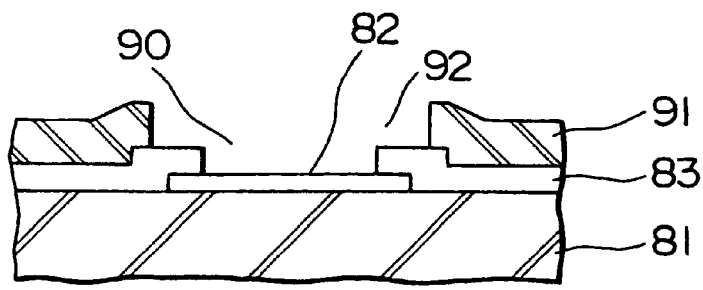
FIGS. 2A to 2D are sectional views of the wafer, showing the details of the step shown in FIG. 1A.
Figure 2B:
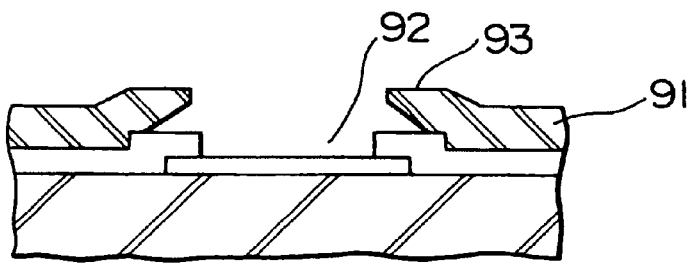
Figure 2C:
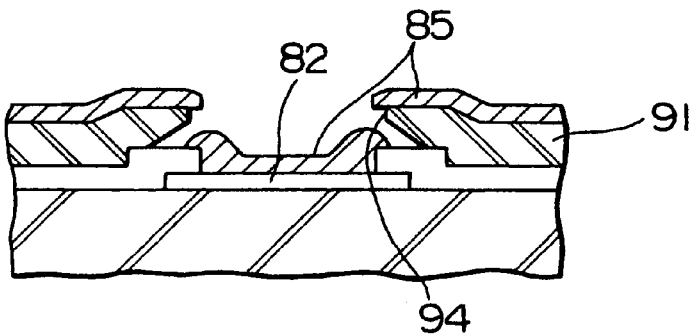
Figure 2D:
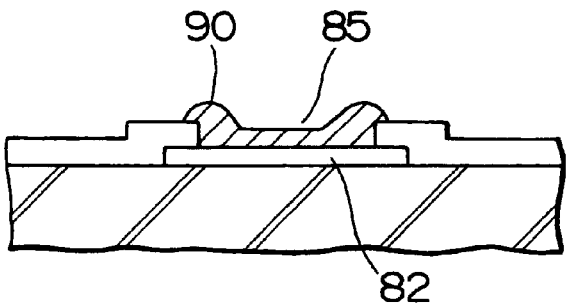
Figure 3:
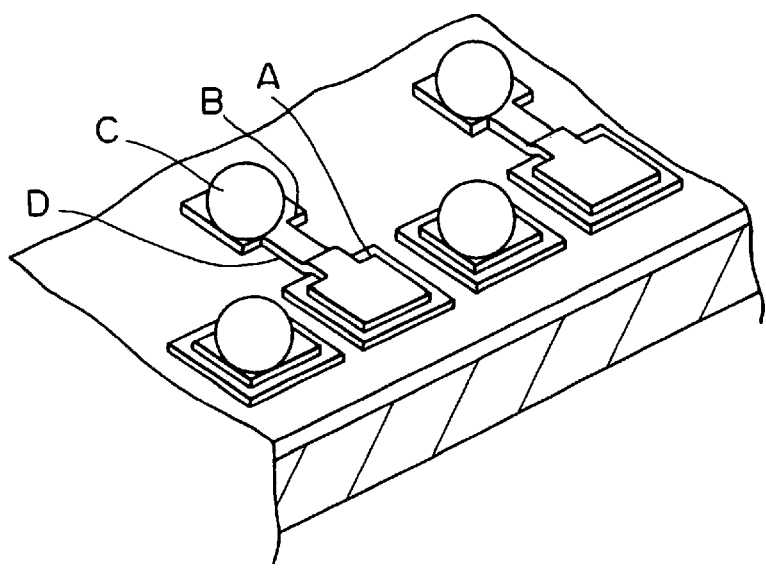
FIG. 3 is a perspective view showing a solder ball bump located on a region different from a region on an electrode pad.
Figure 4A:
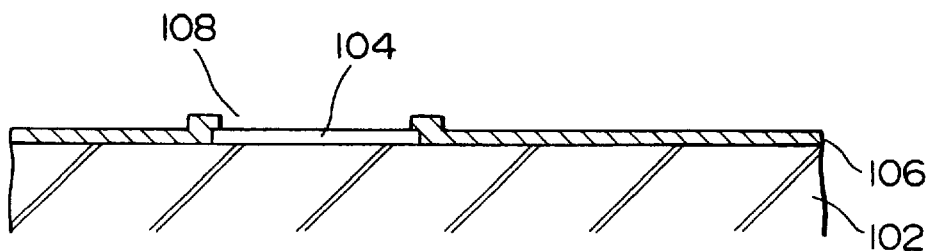
FIGS. 4A to 4G are sectional views of a wafer, showing another related art solder ball bump forming method wherein a solder ball bump is located on a region different from a region on an electrode pad as shown in FIG. 3.
Figure 4B:
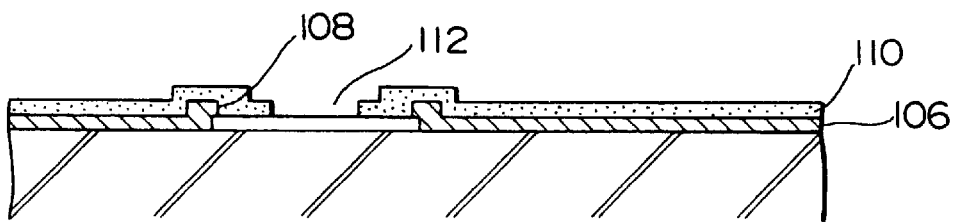
Figure 4C:
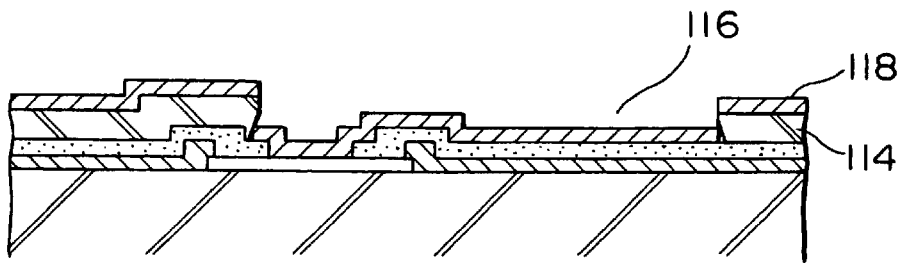
Figure 4D:
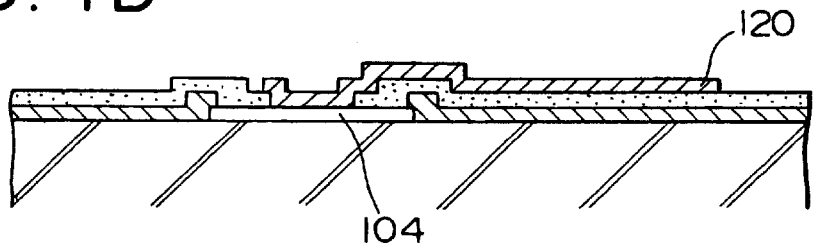
Figure 4E:
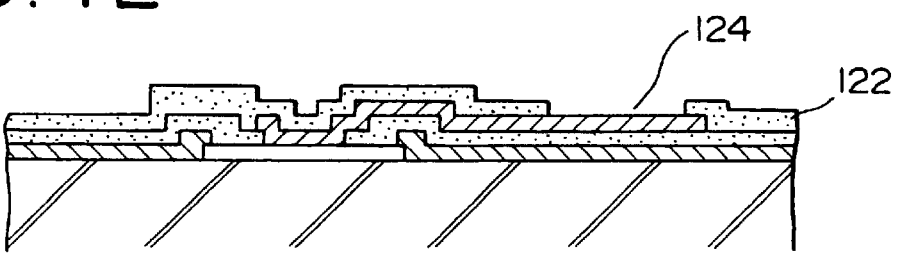
Figure 4F:
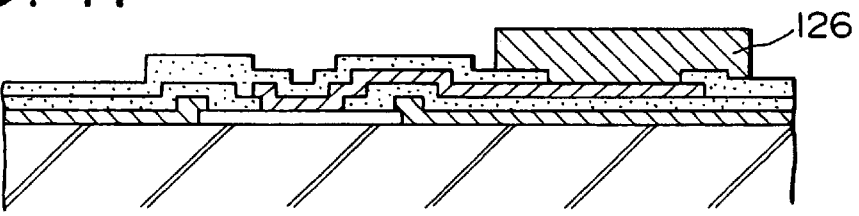
Figure 4G:
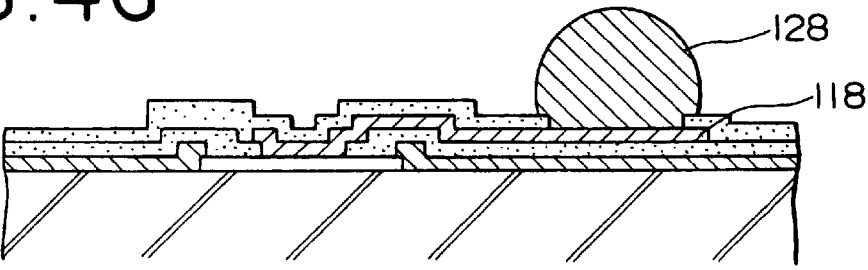

Thereafter, as similarly to the related art method shown in FIGS. 4E and 4F, high melting point solder (Pb:Sn=97:3) is vacuum-evaporated and patterned. In the next wet back step, a flux is applied and the solder is heated to be melted, thereby forming a solder ball bump 128 as shown in FIG. 4G.

In this preferred embodiment, outgassing from the wafer, especially, from the polyimide film as the undercoating is suppressed during the sputter deposition of the BLM film. Accordingly, metal adhesion at the polyimide/BLM interface is improved, and a reduction in contact resistance and wiring resistance can be expected.

Thereafter, the LSI chip is mounted through the above relocated solder ball bumps onto a printed wiring board by flip chip bonding, thereby improving adhesion and electrical characteristics of a semiconductor device at the bump bonding portion. As a result, a final product set incorporating the semiconductor device by the manufacturing process according to the present invention is more improved in reliability and durability than that by the related art manufacturing process.

Fourth Preferred Embodiment

This preferred embodiment is another preferred embodiment of the solder ball bump forming method according to the present invention, wherein the sputter deposition apparatus of the second preferred embodiment is used to form a BLM film pattern. In this preferred embodiment, a wafer is preliminarily subjected to vacuum heating in the load-lock chamber 52 having a lamp heater, and thereafter the wafer is fed to the parallel-plate type plasma processing device 54, in which the wafer is subjected to back-sputtering.

As similarly to the third preferred embodiment, the wafer W having a multilayer structure shown in FIG. 7A is prepared, and next set in the load-lock chamber 52 of the sputter deposition apparatus 50 to perform vacuum heating as a first-stage pretreatment for deposition of a BLM film under the following conditions. The vacuum heating is performed by maintaining a vacuum in the load-lock chamber 52 and heating the wafer W by the heat from the electric heater 60 embedded in the wafer stage 56 and the radiation from the infrared lamp 58 on the ceiling of the load-lock chamber 52. Accordingly, the wafer W can be quickly heated and its temperature can be controlled uniformly and precisely to thereby allow sufficient curing of the first polyimide film 110.

(1) Vacuum Heating

Pressure in the load-lock chamber: $1 \times 10^{-3}$ Pa or less

Wafer stage temperature: 110° C.

Infrared lamp: ON

Process time: 120 seconds

Next, the wafer W is fed to the plasma processing device 54 to perform back-sputtering under the following conditions as a second-stage pretreatment for deposition of the BLM film.

(2) Back-sputtering

Ar flow rate: 25 sccm

Pressure in the chamber: 0.7 Pa

Wafer stage temperature: 50° C.

RF applied power: 300 W (13.56 MHz)

Process time: 5 minutes

By the back-sputtering, the surface layer of the photoresist film 114 undergoes bombardment by the $Ar^+$ions from the discharge plasma, so that the side wall of the third opening 116 formed through the resist pattern is deformed like an overhang to reduce the diameter of the third opening 116 at its opening edge 130 as shown in FIG. 7B.

By the vacuum heating in the load-lock chamber 52 independent of the chamber 72 for performing plasma processing, the moisture contained in the polyimide film as the undercoating for the BLM film is effectively removed from the wafer. Further, in the back-sputtering, the deformation and opening diameter reduction process for the opening of the resist pattern gradually proceeds at a low substrate bias voltage with the wafer being exposed to radiant heat from the plasma and incident energy of the ions. Thus, optimum pretreatment for application to a lift-off process can be carried out.

Accordingly, by the preliminary curing effect in this preferred embodiment, there is no possibility that the moisture removed from the wafer may contaminate the plasma chamber of the plasma processing device for performing back-sputtering as in the related art. In addition, the amount of gases releasing from the undercoating in the back-sputtering can be reduced. Accordingly, even when the number of wafers to be processed is increased, the pretreatment can be optimized to the applicability of a lift-off process and the process stability can be greatly improved.

In the next step, the wafer W subjected to the pretreatment is fed to the sputter deposition device to form a BLM film 118 as similarly to the third preferred embodiment.

By the pretreatment mentioned previously, no metal film is deposited on the overhanging side wall surface of the third opening 116 of the resist pattern as shown in FIG. 7C, but the BLM film 118 is deposited separately in a bottom region of the first opening 108 and in a region on the photoresist film 114.

By the effect of the preliminary vacuum heating, outgassing from the polyimide film as the undercoating is effectively suppressed during the sputter deposition of the BLM film, thereby eliminating an adverse effect of impurity gases on a process atmosphere and allowing sputter deposition of the BLM film 118 with a high purity.

In the next step, the photoresist film is lifted off to thereby form a rewiring pattern 120 of the BLM film (FIG. 7D) as similarly to the third preferred embodiment, and thereafter a solder ball bump 128 is formed as similarly to the third preferred embodiment.

In this preferred embodiment, outgassing from the wafer, especially, from the polyimide film as the undercoating is effectively suppressed during the sputter deposition of the BLM film as similarly to the third preferred embodiment. Accordingly, metal adhesion at the polyimide/BLM interface is further improved, and a further reduction in contact resistance and wiring resistance can be expected.

Thereafter, the LSI chip is mounted through the above relocated solder ball bump onto a printed wiring board by flip chip bonding, thereby improving adhesion and electrical characteristics of a semiconductor device at the bump bonding portion like or more than the third preferred embodiment. As a result, a final product set incorporating the semiconductor device by the manufacturing process according to the present invention is more improved in reliability and durability than that by the related art manufacturing process.

While the specific preferred embodiments of the solder ball bump forming method according to the present invention have been described, it should be noted that the method of the present invention is not limited to the above preferred embodiments, but various other wafer layer structures, process devices, process conditions, and so on may be suitably selected without departing from the scope of the present invention.

For example, while the solder bump pattern forming method in the above preferred embodiments includes film deposition by vacuum evaporation and lift-off of the photoresist, any other methods using electroplating or the like may be adopted.

What is claimed is:

1. A method of forming a solder connection to a semiconductor comprising the steps of:

forming over a substrate an insulating layer having an opening which exposes an electrode pad;

forming a resist layer over said insulating film;

patterning the resist to provide a solder bump forming region and a wiring forming region connecting the electrode pad and the solder bump forming region thereafter, heating said insulating film prior to applying a metal layer by sputtering; and depositing a metal film on said insulating layer by sputtering.

2. A solder bump forming method according to claim 1, wherein said heating step is performed under a high vacuum.

3. A solder bump forming method according to claim 1, wherein said insulating film is an organic compound film.

4. A solder bump forming method according to claim 2, wherein said insulating film is an organic compound film.

5. A solder bump forming method according to claim 3, wherein said organic compound film is a polyimide film.

6. A solder bump forming method according to claim 4, wherein said organic compound film is a polyimide film.

7. A solder bump forming method according to claim 1, wherein said metal film is a multilayer metal film having a barrier metal layer.

8. A solder bump forming method according to claim 2, wherein said metal film is a multilayer metal film having a barrier metal layer.

9. A solder bump forming method according to claim 3, wherein said metal film is a multilayer metal film having a barrier metal layer.

10. A solder bump forming method according to claim 4, wherein said metal film is a multilayer metal film having a barrier metal layer.

11. A solder bump forming method according to claim 5, wherein said metal film is a multilayer metal film having a barrier metal layer.

12. A solder bump forming method according to claim 6, wherein said metal film is a multilayer metal film having a barrier metal layer.

13. A solder bump forming method according to claim 7, wherein said multilayer metal film is a BLM (Ball Limiting Metal) film.

14. A solder bump forming method according to claim 8, wherein said multilayer metal film is a BLM (Ball Limiting Metal) film.

15. A solder bump forming method according to claim 9, wherein said multilayer metal film is a BLM (Ball Limiting Metal) film.

16. A solder bump forming method according to claim 10, wherein said multilayer metal film is a BLM (Ball Limiting Metal) film.

17. A solder bump forming method according to claim 11, wherein said multilayer metal film is a BLM (Ball Limiting Metal) film.

18. A solder bump forming method according to claim 12, wherein said multilayer metal film is a BLM (Ball Limiting Metal) film.

19. The method of claim 1, wherein the step of heating comprises generating heat with an infrared lamp.

20. The method of claim 19, wherein the step of heating comprises generating heat with a heating element in a wafer stage.

21. The method of claim 20, wherein the step of heating comprises generating heat with a plasma source.

* * * * *